(12) United States Patent
Dray (10) Patent No.: US 7,782,093 B2
(45) Date of Patent: Aug. 24, 2010

(54) INTEGRATED CIRCUIT AND METHOD OF DETECTING A SIGNAL EDGE TRANSITION (75) Inventor: Cyrille Dray, Antibes (FR)

(73) Assignee: Infineon Technologies AG, Neubiberg (DE)

( * ) Notice: Subject to any disclaimer, the term of this patent is extended or adjusted under 35 U.S.C. 154(b) by 631 days.

(21) Appl. No.: 11/805,305

(22) Filed: May 23, 2007

(65) Prior Publication Data
US 2008/0290899 A1 Nov. 27, 2008

(51) Int. Cl.
H03K 5/22 (2006.01)
(52) U.S. Cl. .................................. 327/24; 365/233.5
(58) Field of Classification Search .................. 327/24; 365/233.5
See application file for complete search history.

(56) References Cited

U.S. PATENT DOCUMENTS

| 3,751,636 | A | * | 8/1973 | Coles, Jr. .............. 235/462.27 |
| 4,039,858 | A | * | 8/1977 | Stewart ..................... 327/51 |
| 4,614,883 | A | * | 9/1986 | Sood et al. ................ 326/106 |
| 5,418,756 | A | | 5/1995 | McClure |
| 5,543,591 | A | * | 8/1996 | Gillespie et al. ......... 178/18.03 |
| 5,945,850 | A | * | 8/1999 | Segan et al. ................. 327/24 |
| 5,995,444 | A | | 11/1999 | McClure |
| 6,252,447 | B1 | | 6/2001 | McClure |
| 6,346,823 | B1 | | 2/2002 | Kim |

* cited by examiner

Primary Examiner—Lincoln Donovan
Assistant Examiner—William Hernandez
(74) Attorney, Agent, or Firm—Slater & Matsil, L.L.P.

(57) ABSTRACT

The invention relates to an edge transition detector, and a method of operating an edge transition detector. An integrated circuit includes an edge transition detector for producing an output signal at an output node in response to an input signal. The edge transition detector includes a switch coupled to the output node. The edge transition detector includes a logic device with a first input coupled to the input node and an output coupled to a control terminal of the switch to enable the switch to conduct, thereby effecting a transition of the output signal from a first logic level to a second logic level in response to the input signal. A feedback path is provided from the output node to a second input of the logic device to disable switch conductivity when the output signal completes the logic transition from the first logic level to the second logic level.

25 Claims, 12 Drawing Sheets

INTEGRATED CIRCUIT AND METHOD OF DETECTING A SIGNAL EDGE TRANSITION

TECHNICAL FIELD

An embodiment of the invention generally relates to integrated circuits, a signal edge transition detector, a method of operating an integrated circuit, and a method of operating a signal edge transition detector.

BACKGROUND

In the development of integrated circuits such as an SRAM memory circuit with internal operations synchronized with an internally or externally generated input signal such as a clock signal or other input signal that is nonperiodic, it is often necessary to set a signal line such as a WLEN ("word line enable") or BLEN ("bit line enable") signal line to a logic high state for a short period of time to enable the internal operation. Generally, after the short period of time, the signal line state is returned to a logic low state to terminate the operation by a signal such as an internally or externally generated clear signal ("CLEAR"). It is essential when enabling internal operations of a device that the signal on the signal line be sufficiently long to assure its normal signaling function, but not unnecessarily long so as to slow overall device operation. Device speed, such as a memory cycle time, is often a carefully watched performance metric for product market acceptance. Device speed receives substantial attention during a product development phase. Thus, it is important to generate a signal on such a signal line with minimum acceptable pulse duration.

A signal line, such as a WLEN or BLEN signal line, is often coupled to an extensive set of circuit nodes, each with capacitance that may be unknown or substantially variable across manufacturing runs for a product. In addition, such signal lines are generally maintained in a logic high or logic low state by a latch such as a latch formed with a pair of cross-coupled inverters, where the output of one inverter is coupled to the input of the other. Latches formed with such inverters require significant drive energy to be transitioned from one logic state to the other. Therefore, the minimum drive signal magnitude and its duration to transition the state of a latch and associated circuit nodes can also be substantially variable across manufacturing runs, and even be substantially variable over a range of device operating temperatures. A need thus exists for an improved process and method to produce a signal on a signal line in response to an edge transition of an input signal that can overcome such deficiency.

SUMMARY OF THE INVENTION

In accordance with one exemplary embodiment of the invention, an integrated circuit is provided. The integrated circuit includes an edge transition detector for producing an output signal at an output node in response to an input signal coupled to an input node. The edge transition detector includes a switch coupled to the output node. The edge transition detector further includes a logic device with a first input coupled to the input node and an output coupled to a control terminal of the switch to enable the switch to conduct, thereby effecting a transition of the output signal from a first logic level to a second logic level in response to the input signal. A feedback path is provided from the output node to a second input of the logic device to disable switch conductivity when the output signal completes the transition from the first logic level to the second logic level.

BRIEF DESCRIPTION OF THE DRAWINGS

In the figures, identical reference symbols generally designate the same component parts throughout the various views. In the description below, various exemplary embodiments of the invention are described with reference to the following drawings, in which.

DETAILED DESCRIPTION OF ILLUSTRATIVE EMBODIMENTS

An important branch of semiconductor technology is the development of memory cells or memory devices composed of one or more memory cells, such as the development of elements for storing data, generally in the form of binary information units, i.e., bits (binary digits). "Cycle time," i.e., the time between the beginning of a read/write operation and the beginning of a further read/write operation, such as performed in an SRAM memory device, is an important design parameter that affects applicability of a particular memory device in a high-performance digital system. Substantial design effort is generally expended to minimize the cycle time of a memory device. A parameter that affects minimum cycle time is the speed at which an output signal, such as an SRAM memory device write line enable signal or a bit line enable signal, is asserted in response to an input signal, particularly in response to the rising edge of an input signal, and can then be returned to its quiescent logic state by a CLEAR signal. It is important in such designs to minimize the time that the output signal is asserted, so that the output signal advantageously can be disabled as soon as possible. Toward this end, a logic low pulse-width duration of a signal to drive an output PMOS switch producing an output signal in an embodiment of the invention is self adaptive, employing a feedback loop to disable an internal drive signal therefor when the output signal sufficiently completes a transition to a desired logic level.

The invention will now be described with respect to an exemplary embodiment, namely a circuit for generating an enable signal. It is understood, however, that the invention is not limited to this particular implementation, such as an SRAM memory device. Other signals can be generated in different contexts using inventive concepts described herein.

Figure 1:
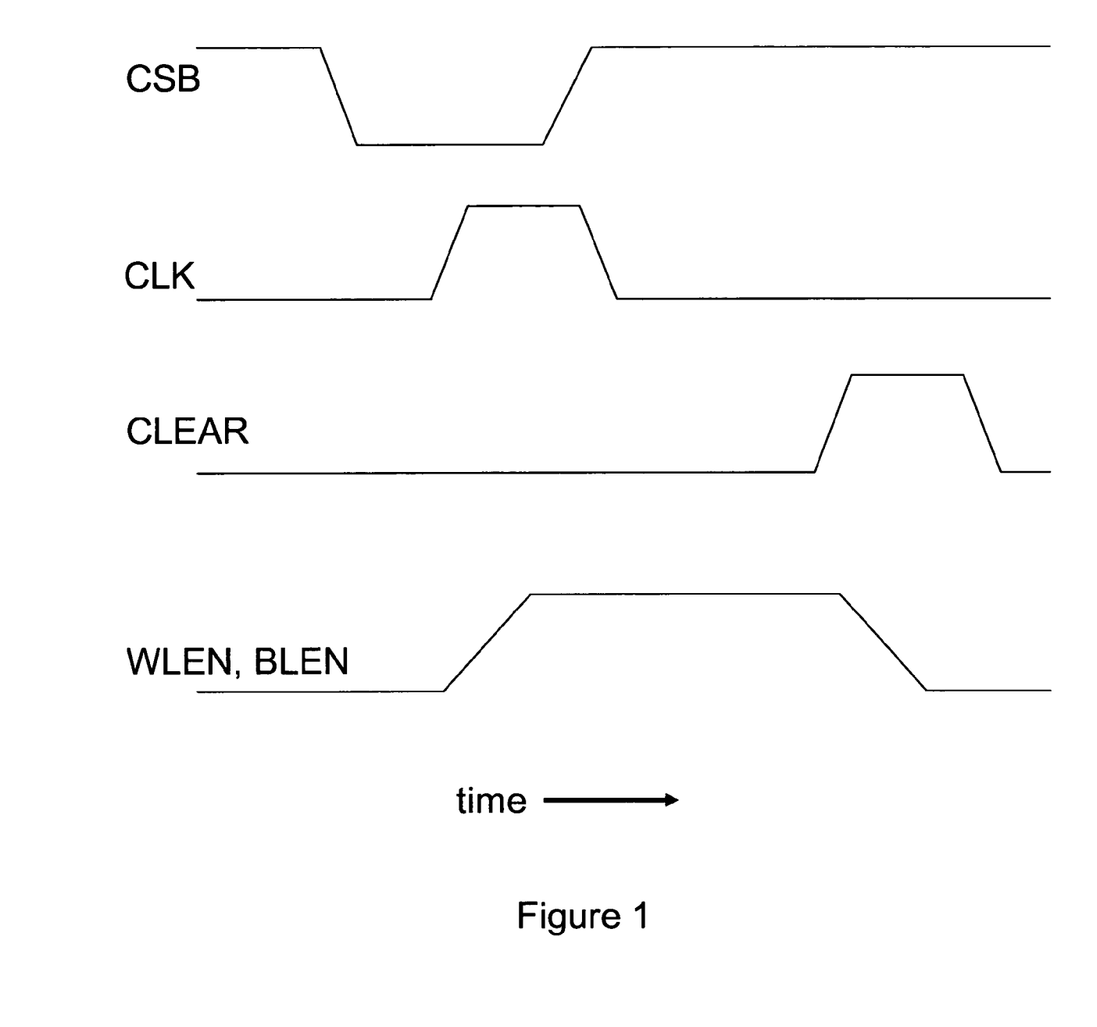
FIG. 1 illustrates a sequence of input signals applied to an edge transition detector and a resulting output signal in an exemplary embodiment of the invention.

Turning now to FIG. 1, a timing diagram illustrates a sequence of input signals CSB ("chip select bar"), CLK ("clock"), and CLEAR that are applied to an edge transition detector in an exemplary embodiment of the invention. The input signal CLK may be a general enabling signal for a device, and is not necessarily restricted to being the periodic output of a clock generator. The input signal CSB represents a selection signal for a memory device that identifies the particular memory device whose internal operations will be enabled by the output signal. The input signal CSB operates with inverted logic in the sense that a transition to a logic low state signals, without limitation, device enablement. It is important in improving the response time of the circuit that the CSB set-up time also be minimized. Toward this end, the internal CSB set-up time, representing the time after the CSB input signal makes a logic low transition until receiving an input signal edge transition, advantageously is independent of the logic low pulse-width duration of the signal to drive the output PMOS switch producing the output signal.

During the pulse period when the input signal CSB is low, an input signal CLK transitions to a logic high state for a short period of time, as illustrated in the figure. The rising edge of the input signal CLK signals the edge transition detector to transition an output signal, such as a WLEN or BLEN signal, to a logic high state. It is desired that the output signal WLEN or BLEN advantageously be transitioned rapidly to a high logic state in response to the input signal CLK, and that a drive process within the edge transition detector be disabled quickly so that the output signal can be returned to a logic low state in response to an input CLEAR signal, which may be internally generated, transitioning to a logic high state. In this manner, the need for a conservatively overdesigned drive process for the output signal line, which would otherwise lengthen a minimum time interval during which a CLEAR signal cannot be applied, can be avoided in an embodiment of the invention. The need to trade off a longer pulse width for a switch, such as a PMOS switch, against a longer CSB set-up time can thereby be avoided. The result is a shorter CSB set-up time with a sufficiently long logic low pulse width for a PMOS gate.

Figure 2:
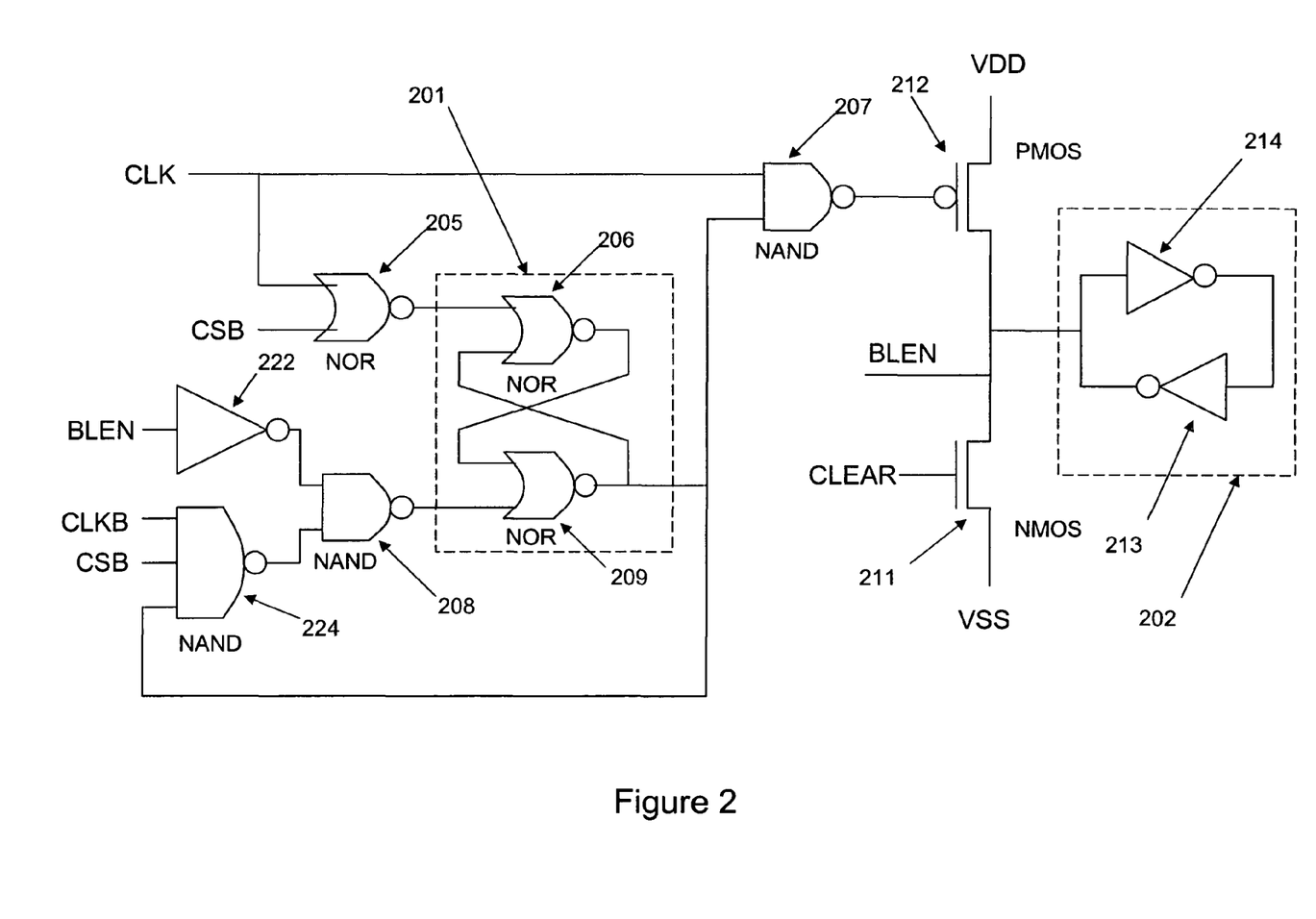
FIG. 2 illustrates an exemplary circuit structure for an edge transition detector constructed according to the principles of the invention.

Turning now to FIG. 2, an exemplary logic structure for an edge transition detector is constructed according to the principles of an embodiment of the invention in which an output signal, such as a BLEN signal, drives a load with unknown characteristics. The drive process for the output signal advantageously is operative for a minimum period of time by feeding back the output signal to the drive logic to disable the drive process as soon as the output signal has been transitioned to a desired logic state.

The load for the output signal as illustrated in FIG. 2 includes latch 202. Latch 202 is formed with inverters 213 and 214, with the output of each inverter coupled to the input of the other. Latch 202 is stable in either of two logic states, wherein the output of one inverter is high and the output of the other is low. To transition the latch to the other state requires that the output of inverter 213 be forced into the other state such as by signal BLEN.

The edge transition detector is coupled to input signals CLK, CSB, and CLEAR, which are sequenced as described previously above to control output signal BLEN. Input signal CLKB is the logical inverse of input signal CLK. The edge transition detector in this exemplary embodiment is constructed with NOR gates 205, 206, and 209, NAND gates 207, 208, and 224, inverter 222, and the totem-pole output driver formed with PMOS switch 212 and NMOS switch 211. The totem-pole output driver is coupled to input bias voltage source VDD, such as a 1.8 V source, and VSS, representing local circuit ground. The outputs of NOR gates 206 and 209 are coupled to an input of the opposite gate to form S-R ("set-reset") flip-flop 201.

In some applications of an edge transition detector, multiple output signal lines, such as a BLEN signal line and a WLEN signal line, are controlled by a common set of input signals CSB, CLK, CLKB, and CLEAR. In such applications a common logic structure can be used to control multiple output signals by feeding back each output signal to the common logic structure.

Figure 3:
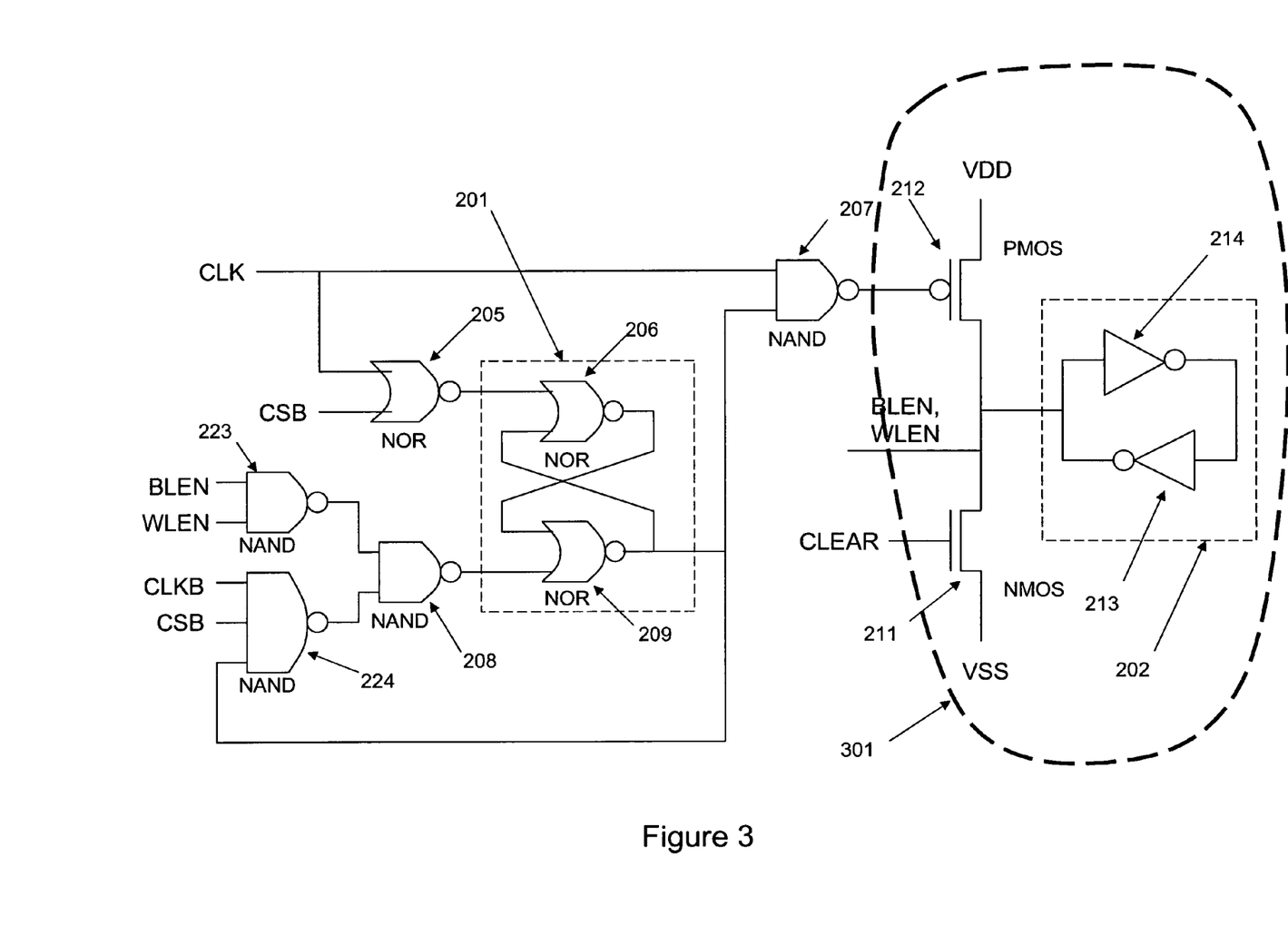
FIG. 3 illustrates an edge transition detector constructed according to the principles of the invention driving multiple output signal lines.

Turning now to FIG. 3, an edge transition detector in an embodiment of the invention driving multiple output signal lines is coupled to an output drive circuit comprising a PMOS switch 212, an NMOS switch 211, and an output latch 202. In this exemplary embodiment, the logic structure previously described hereinabove is maintained with the exception of NAND gate 223 that replaces inverter 222 previously described with reference to FIG. 2. The structure illustrated in the area enclosed by dashed line 301 can be replicated to drive the separate output signal lines, such as a BLEN signal line and a WLEN signal line. One replicated structure may provide an output signal WLEN (not shown in the figure as a separate output signal) that is coupled to an input of NAND gate 223. In this manner the output of NAND gate 223 is maintained in logic state 1 until all output signals have been transitioned to logic state 1, at which time the output of NAND gate 223 transitions to logic state 0, disabling the drive signal to PMOS switch 212 by means of logic coupled therebetween.

Figure 4:
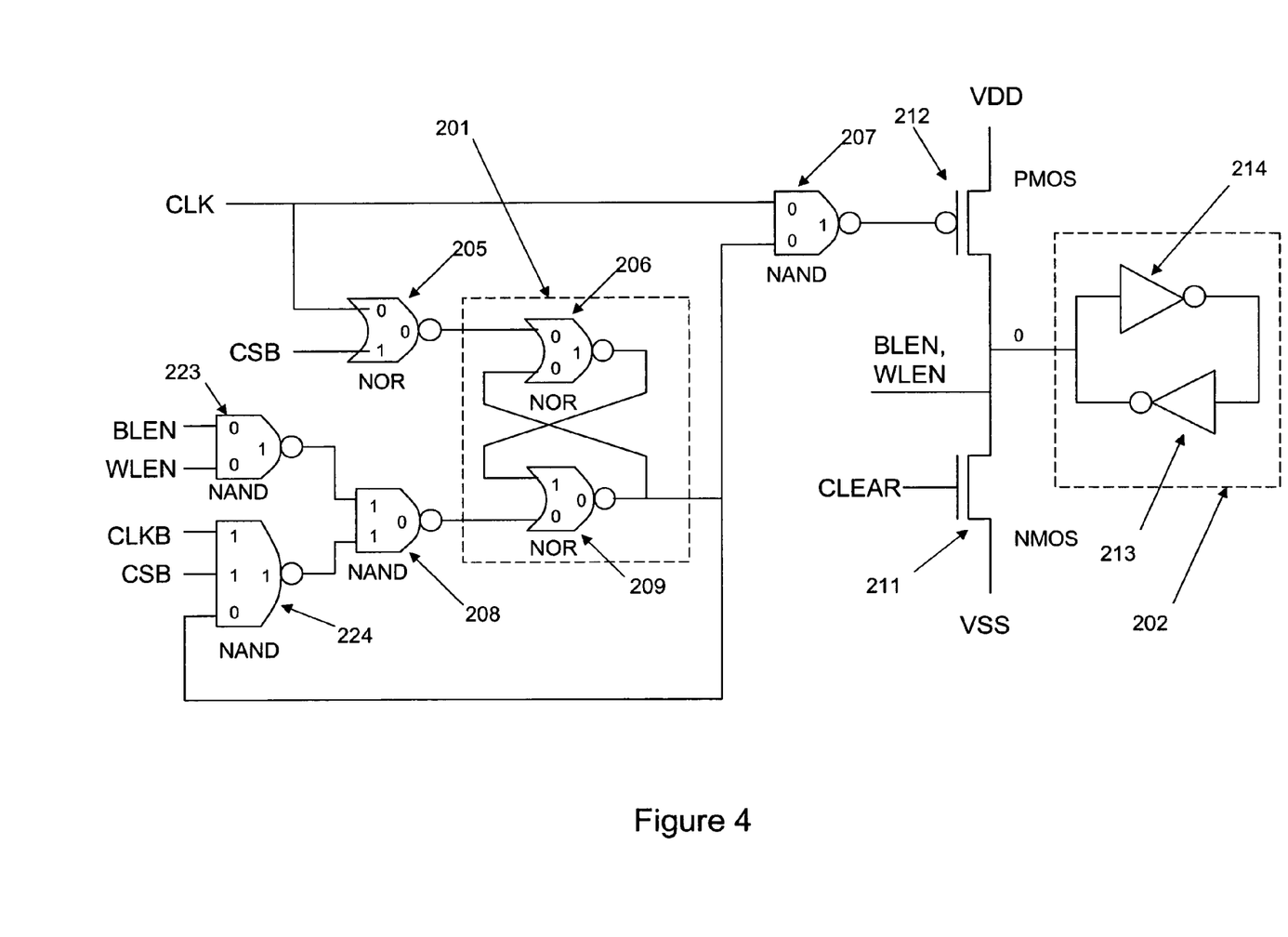
FIGS. 4-10 illustrate an exemplary sequence of logic operations of an edge transition detector constructed according to the principles of the invention.

An edge transition detector in an embodiment of the invention operates as illustrated and described now with reference to FIGS. 4-10, producing an output signal BLEN in response to a sequence of input signals CSB, CLK, and CLEAR as described previously hereinabove with reference to FIG. 1, and input signal CLKB, the logical inverse of input signal CLK. Turning first to FIG. 4, at start-up, the output of NOR gate 206 is high i.e., it is in logic state 1, and the output of NOR gate 209 is low. In a system start-up state, if the output of NOR gate 209 were high, then the logical loop comprising NAND gates 224 and 208 would reset NOR gate 209 so that its output is low, as illustrated in FIG. 4. In an initial state prior to detecting the falling edge of chip select signal CSB, clock signal CLK is illustrated in logic state 0, chip select signal CSB is illustrated in logic state 1, and the logical inverse clock signal CLKB is in logic state 1. Both inputs of NAND gate 207 are low, the output of NAND gate 207 is 1, and output signal BLEN is low. Input signal CLEAR at this time is in logic state 0.

Figure 5:
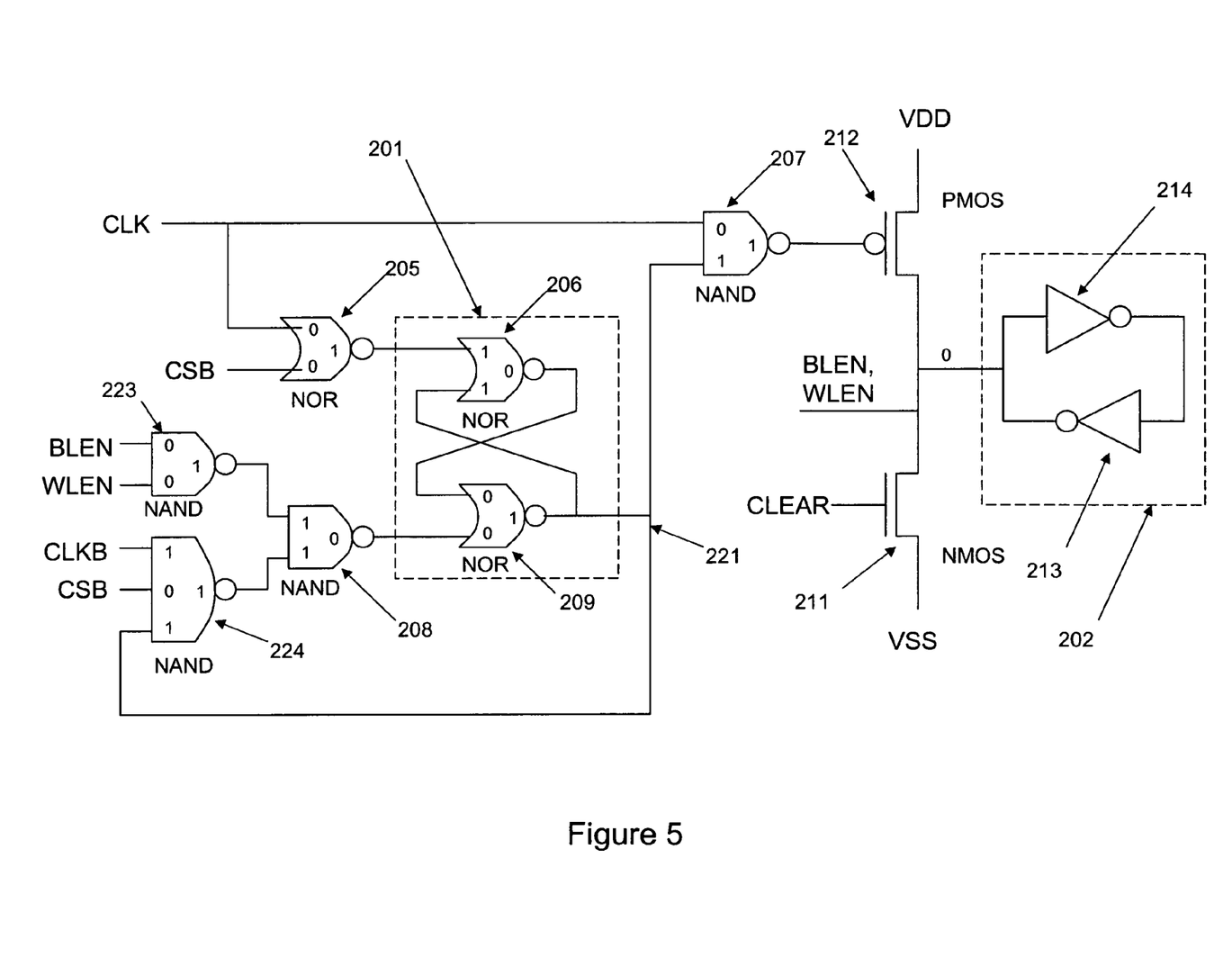

Turning now to FIG. 5, input signal CSB transitions to logic state 0, forcing the output of NOR gate 205 to logic state 1, which sets the output 221 of S-R latch 201 formed with gates 206 and 209 to logic state 1. The output of NAND gate 207 remains in logic state 1. Output signal BLEN remains in logic state 0 at this time.

Figure 6:
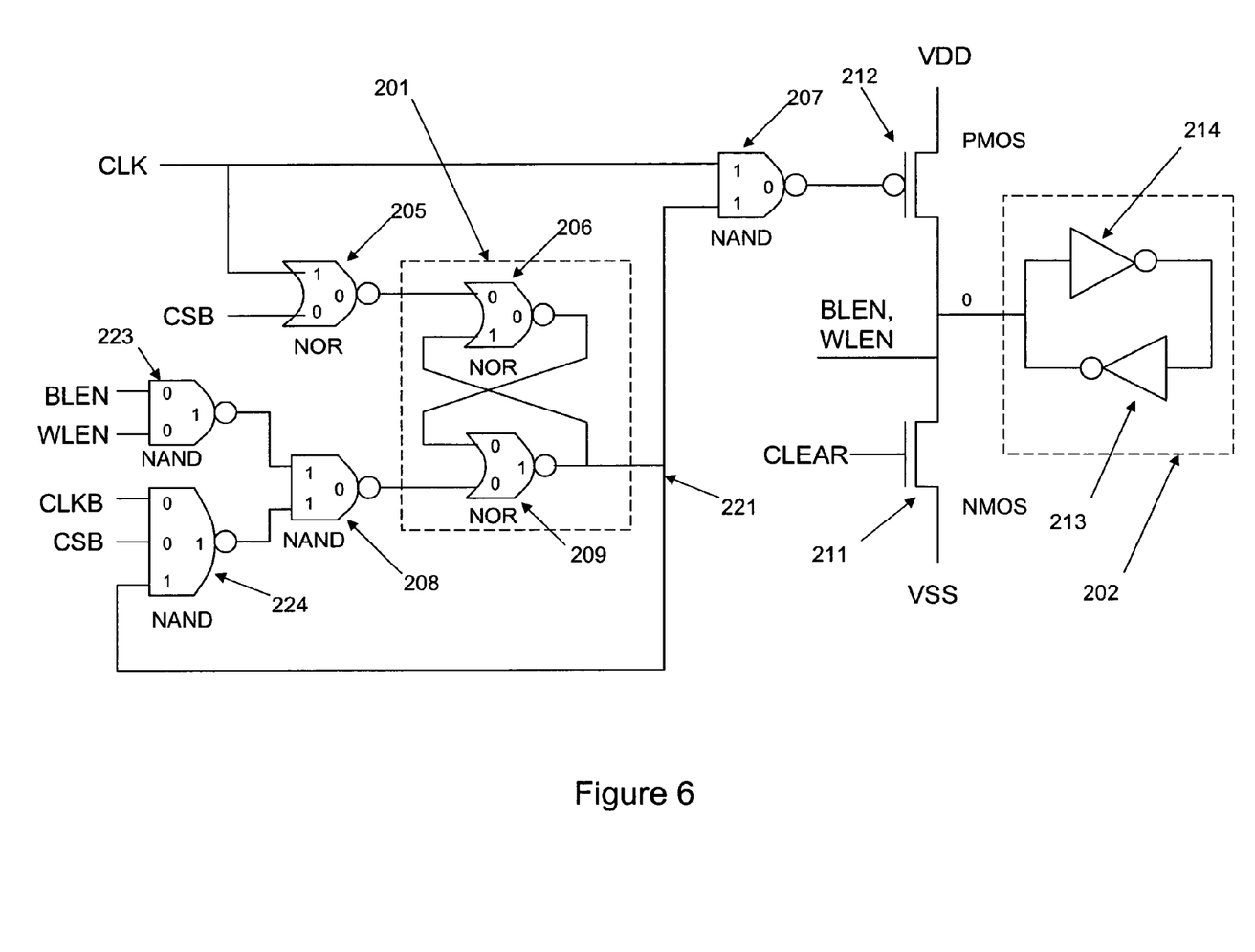

Turning now to FIG. 6, input signal CLK transitions to logic state 1, and its rising leading edge is detected by NOR gate 205, transitioning its output to logic state 0, which has no immediate effect. However, the transition of input signal CLK also causes the output of NAND gate 207 to transition to logic state 0, i.e., it goes low, which turns on PMOS switch 212, which acts to pull up output signal BLEN to logic state 1.

Figure 7:
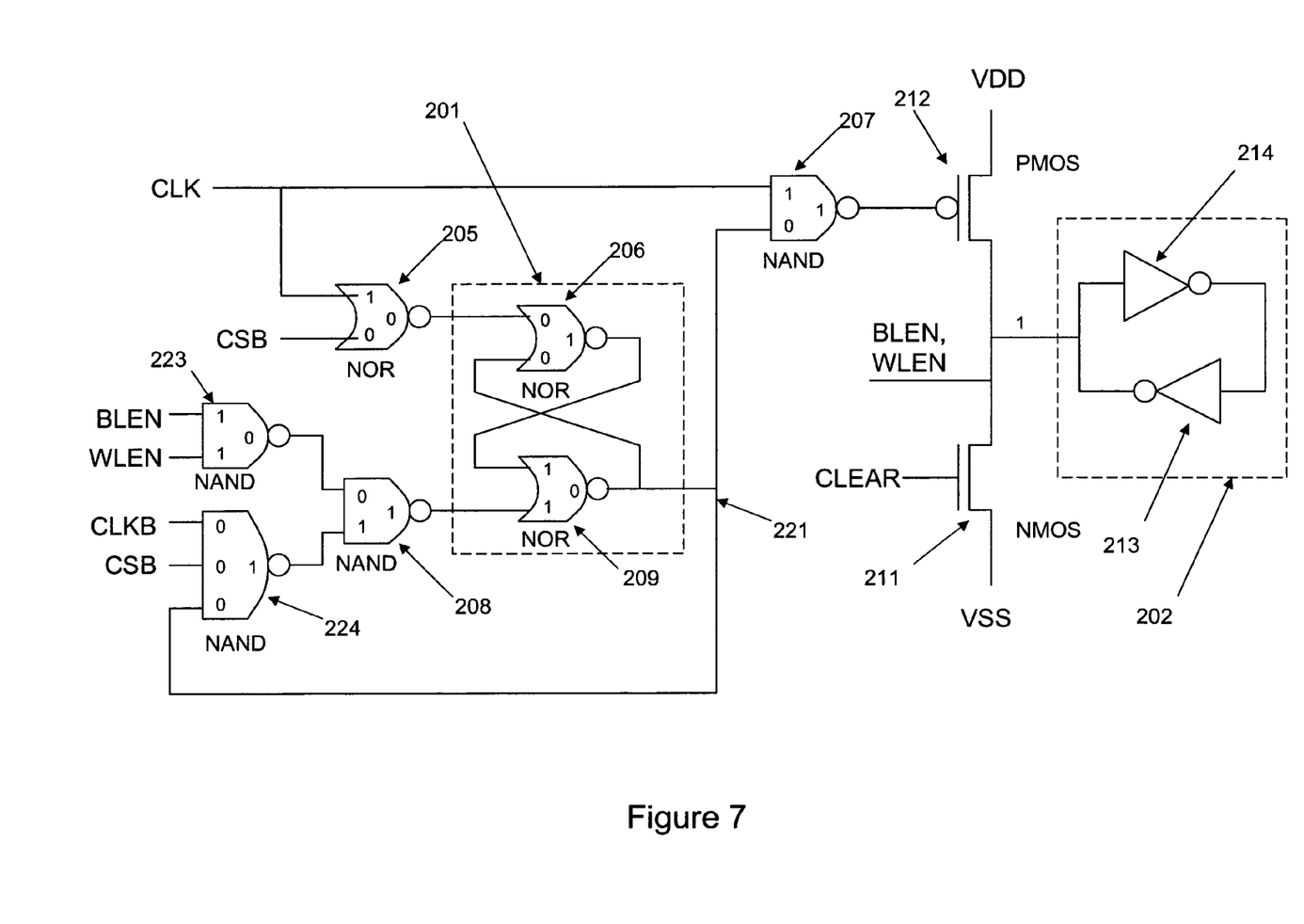

Turning now to FIG. 7, output signal BLEN is now illustrated in logic state 1. As a result, the output of NAND gate 223 transitions to logic state 0, the output of NAND gate 208 transitions to logic state 1, and the output of NOR gate 209 transitions to logic state 0. This results in the output of NAND gate 207 transitioning to logic state 1, i.e., it goes high, disabling conductivity of PMOS switch 212. The latch formed with inverters 213 and 214 holds output signal BLEN in logic state 1, not relying thereby on conductivity of PMOS switch 212.

Figure 8:
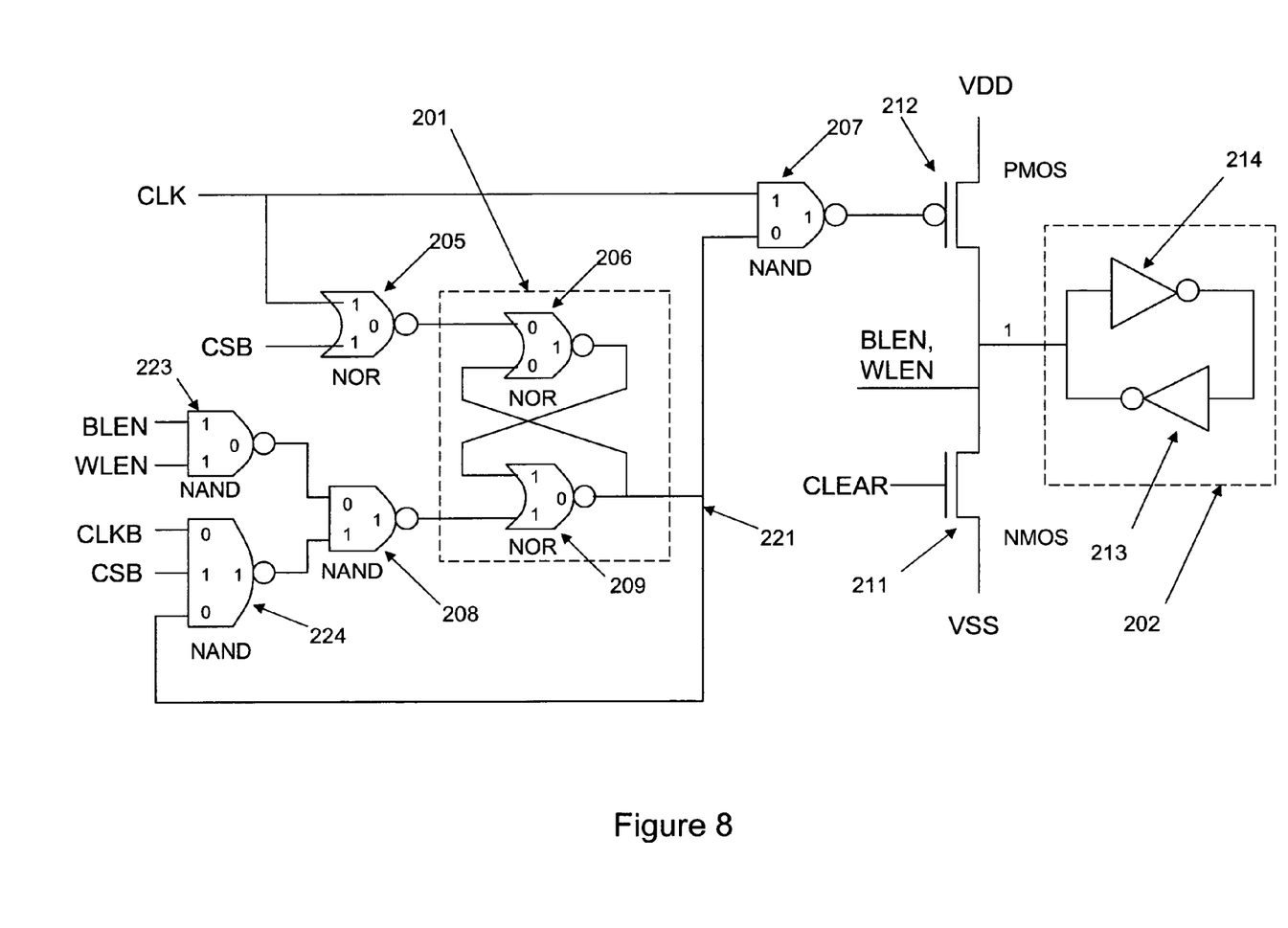

Turning now to FIG. 8, input signal CSB transitions to logic state 1, with no immediate effect on the output of NOR gate 205.

Figure 9:
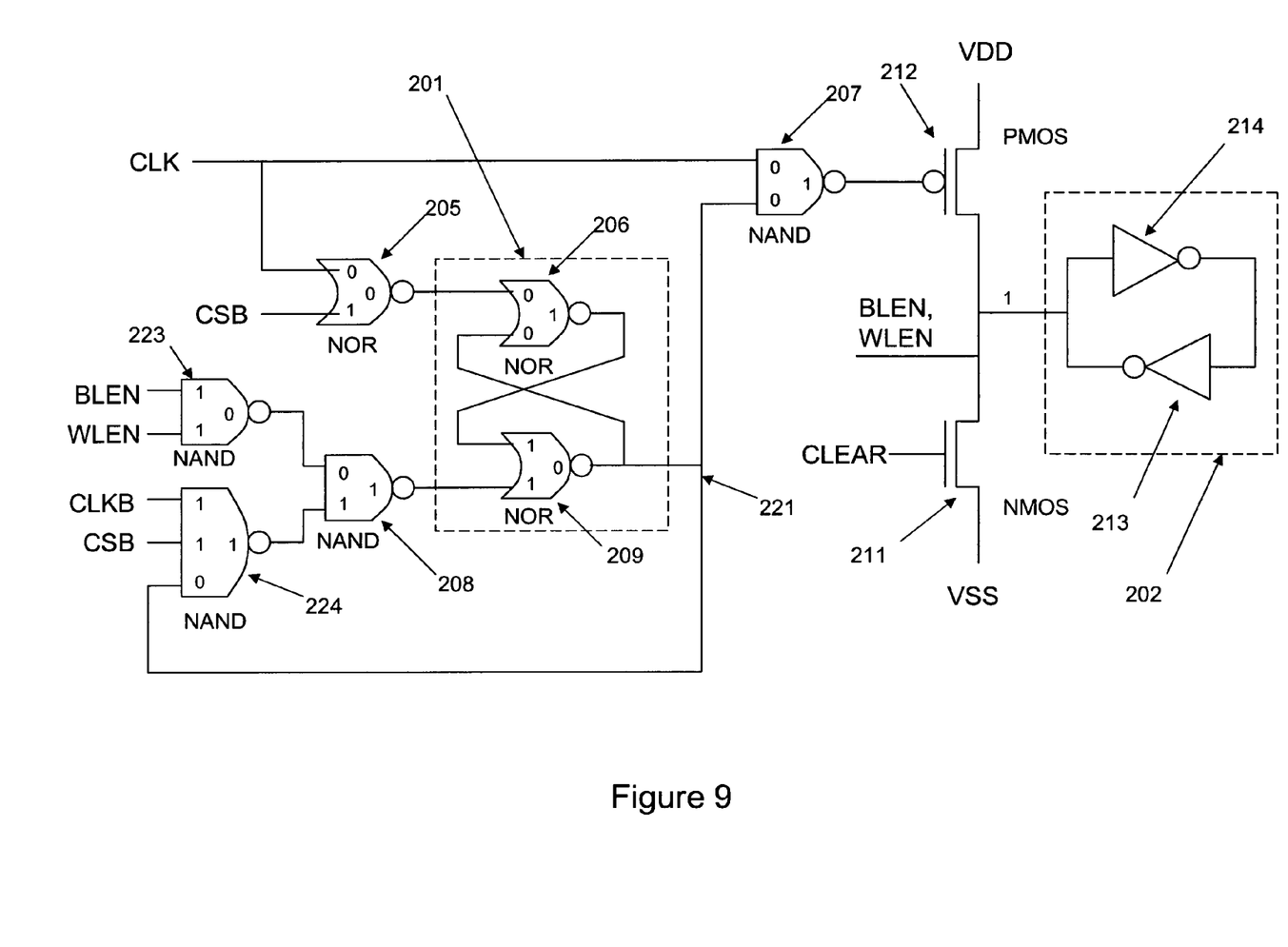

Turning now to FIG. 9, input signal CLK transitions to logic state 0, and its inverse, CLKB, to logic state 0. These logical transitions have no effect at this time on the output of NOR gate 205, or of NAND gate 224. Similarly, the transition of input signal CLK to logic state 0 has no effect at this time on the output of NAND gate 207.

Figure 10:
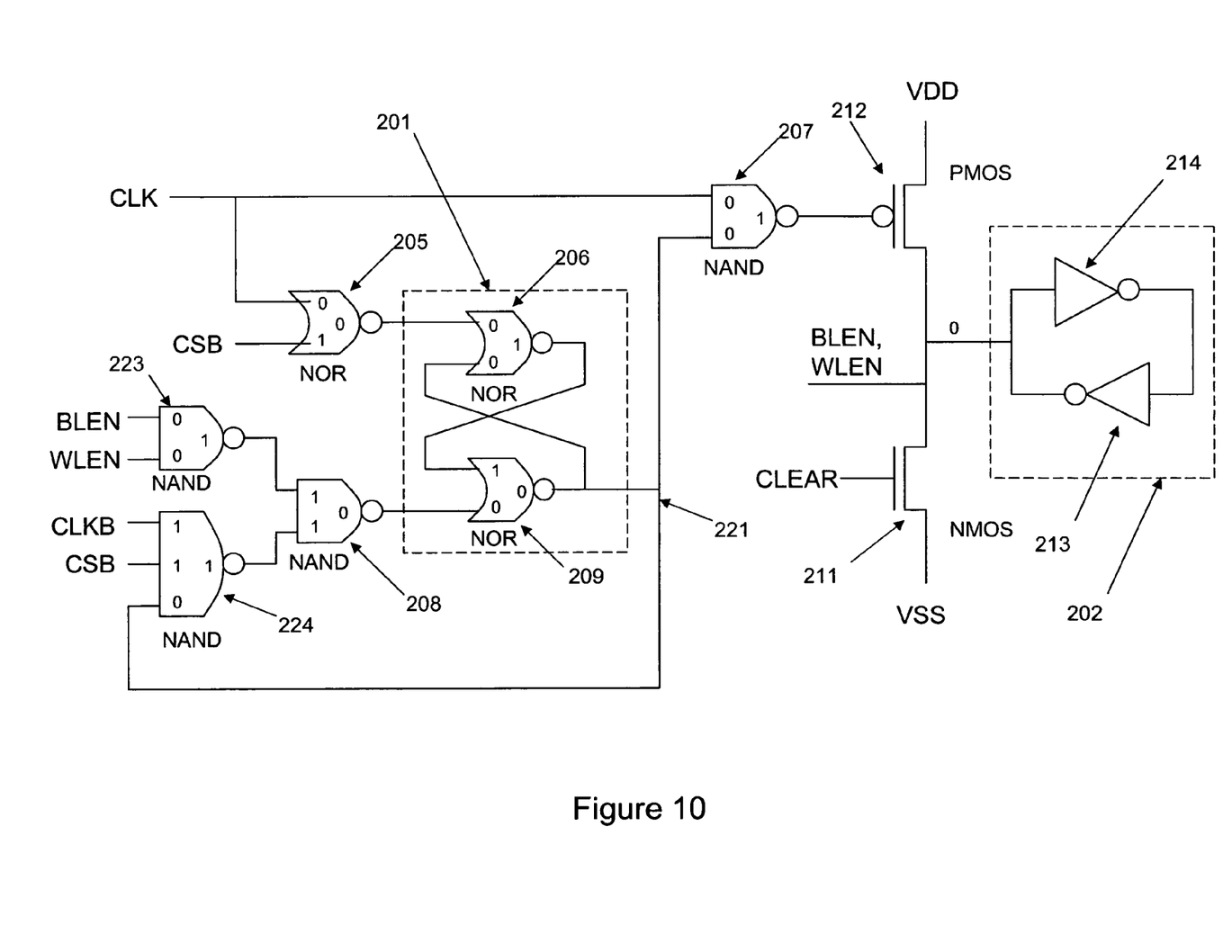

Turning now to FIG. 10, input signal CLEAR transitions to logic state 1, enabling NMOS switch 211 to conduct, causing output signal BLEN to transition to logic state 0 without interference due to conductivity of PMOS switch 212. Correspondingly, output of NAND gate 223 transitions to logic state 1, and output of NAND gate 208 transitions to logic state 0. The output of NOR gate 209 is unaffected.

In this manner, output signal BLEN can be set to a low logic level in a short interval as required by input signal CLEAR, without interference from the rest of the logic.

Figure 11:
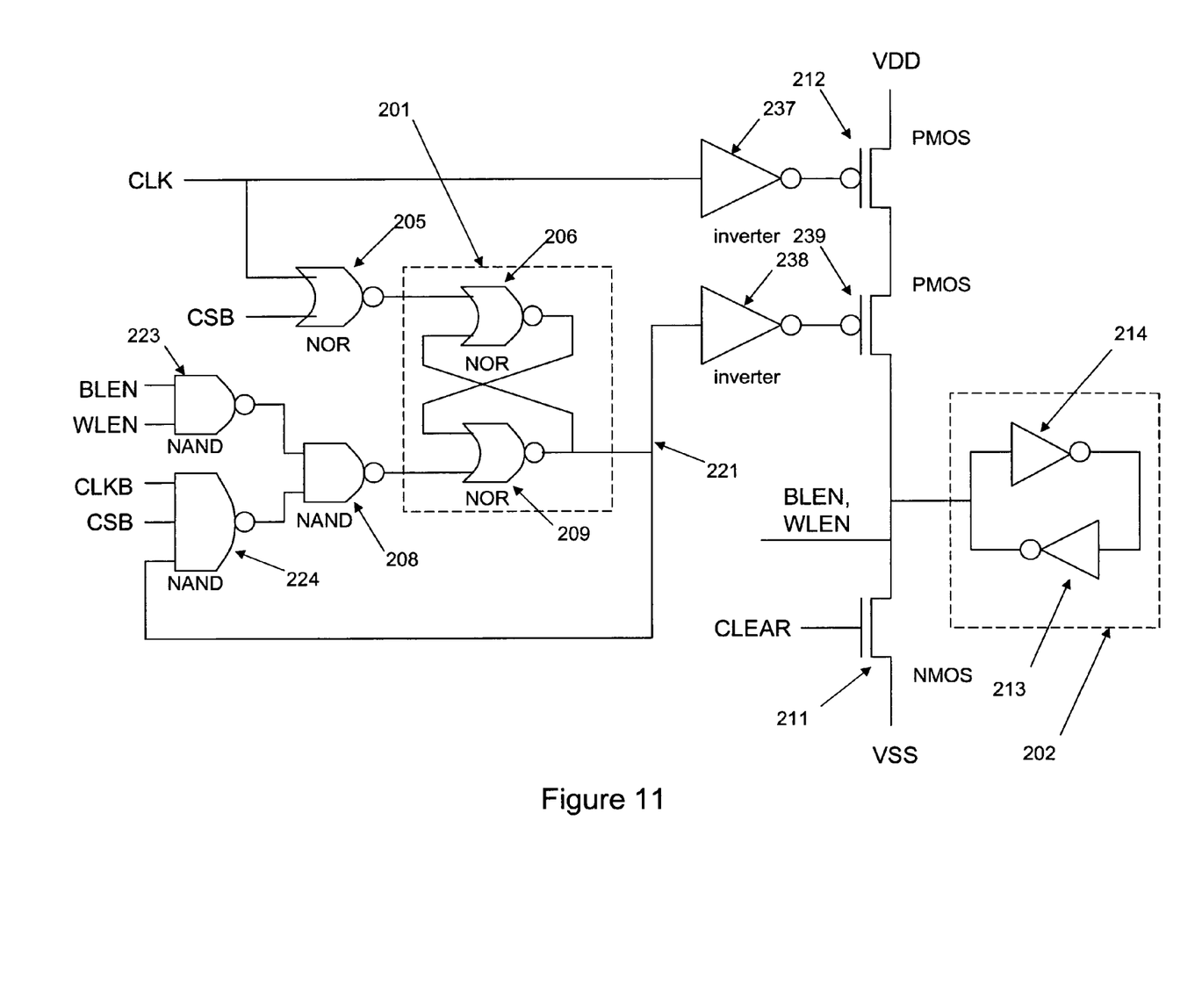
FIG. 11 illustrates an exemplary circuit structure constructed in accordance with the principles of the invention that sets a set-reset flip-flop to a known initial state.

A further embodiment of an edge transition detector, constructed according to the principles of an embodiment of the invention, is illustrated in FIG. 11. In this embodiment, which is similar in structure to that illustrated in FIGS. 2-10, NAND gate 207 has been replaced with a functionally equivalent structure including inverters 237 and 238 and second PMOS switch 239. Thus, when input signal CLK transitions to a logic high state, PMOS switch 212 is enabled to conduct by a logic low signal level coupled to its gate. Similarly, second PMOS switch 239 is enabled to conduct by inverter 238 when output 221 of NOR gate 209 transitions to a logic high state. Both PMOS switches simultaneously conducting pull output signal BLEN (and WLEN) to a logic high state, performing thereby the logical function of NAND gate 207 described previously hereinabove. The remaining elements of FIG. 11 are similar to those described with reference to FIGS. 2-10, and will not be redescribed.

Figure 12:
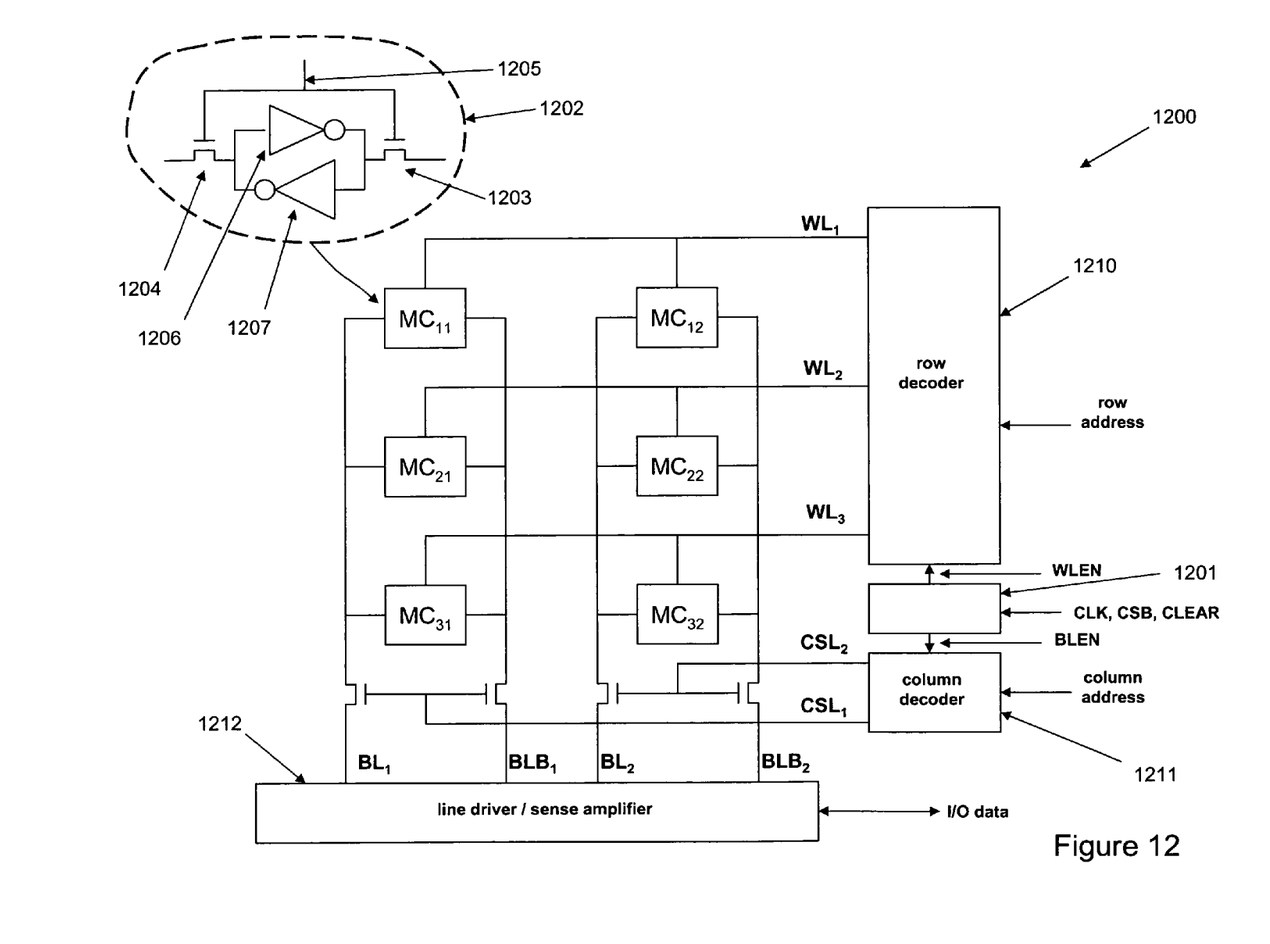
FIG. 12 illustrates a simplified structure for a memory device including an edge transition detector, constructed according to the principles of the invention.

Turning now to FIG. 12, illustrated is a simplified structure for a memory device 1200, such as, without restriction, an SRAM memory device, as an exemplary application of an edge transition detector in an embodiment of the invention. A memory device may be a stand-alone device, i.e., an integrated circuit whose primary function is data storage, or an embedded device, such as a memory device included within the structure of an integrated circuit with a more general function, such as a microprocessor. The memory device includes memory cells $MC_{11}$, $MC_{12}$, . . . , $MC_{32}$. Each memory cell, as illustrated by the structure enclosed within the dashed line 1202, is formed, in a representative embodiment, with a pair of cross-coupled inverters, 1206 and 1207. Each memory cell includes access transistors 1203 and 1204 controlled with switch-select line 1205.

A memory cell is accessed by row decoder 1210 and column decoder 1211 in response to a row address and column address derived from a memory cell address using an addressing structure (not shown), employing a circuit structure well known in the art. The operation of row decoder 1210, which selects a word line, such as word line $WL_1$, and column decoder 1211, which selects a column, such as column-select line $CSL_1$, is respectively enabled by WLEN and BLEN signals produced by edge transition detector 1201 in response to input signals CLK, CSB, and CLEAR, as described previously hereinabove. Data is stored in a selected memory cell by line driver/sense amplifier 1212 in response to input data on the I/O data line. Alternatively, data is read from a selected memory cell by line driver/sense amplifier 1212, and is coupled to the I/O data line for output to an external device, not shown. Thus, a signal edge transition detector is incorporated into a memory device to enable a read or write operation in response to an output signal therefrom. The edge transition detector enables an output signal therefrom for a minimum practical period of time depending on realized characteristics of a load coupled thereto, enabling thereby high-speed performance of the memory device.

An edge transition detector has thus been described, including a switch to transition an output signal on an output node from a first logic level to a second logic level. A feedback path is provided from the output node to an input of a logic device to disable switch conductivity when the output signal completes the transition from the first logic level to the second logic level.

Although an edge transition detector has been described for application to a memory device, it should be understood that other applications of an edge transition detector are contemplated within the broad scope of the invention, and need not be limited to memory devices.

In accordance with one exemplary embodiment of the invention, an integrated circuit is provided. The integrated circuit includes an edge transition detector for producing an output signal at an output node thereof in response to an input signal coupled to an input node thereof. The edge transition detector includes a switch coupled to the output node. The edge transition detector further includes a logic device with a first input coupled to the input node and an output coupled to a control terminal of the switch to enable the switch to conduct, thereby effecting a transition of the output signal from a first logic level to a second logic level in response to the input signal. The edge transition detector further includes a feedback path from the output node to a second input of the logic device, wherein the feedback path disables the switch conductivity when the output signal completes the transition from the first logic level to the second logic level.

In an exemplary embodiment, the switch is enabled to conduct in response to a rising edge of the input signal. In an embodiment of the invention, the switch is a PMOS switch. In a further embodiment, the switch is selectively enabled to conduct by a second input signal, conventionally referred to as a chip select signal. In a further embodiment, the second input signal is a logical inverse of a chip select signal. In a further embodiment, the switch is selectively enabled to conduct by a falling edge of the second input signal. In a further embodiment, a third input signal, conventionally referred to as a CLEAR signal, is coupled to a control terminal of a second switch to reset the output signal to the first logic level. In a further embodiment, the output signal is reset to the first logic level in response to a rising edge of the third input signal. In a further embodiment, said feedback path to said second input of said logic device includes an S-R flip-flop. In a further embodiment, said S-R flip-flop is reset by a second input signal of said edge transition detector coupled to a reset input of said S-R flip-flop.

Another exemplary embodiment of the invention provides a method of operating an integrated circuit including an edge transition detector. In the method, the edge transition detector, in response to an input signal received at an input node thereof, produces an output signal at an output node thereof. In an exemplary embodiment, the method includes applying the received input signal to a logic device. The method further includes applying the output of the logic device to a control terminal of a switch coupled to the output node. The method further includes enabling the switch to conduct by the logic device in response to the input signal, thereby causing the output signal to make a transition from a first logic level to a second logic level in response to the input signal. The method further includes disabling the switch to conduct with a feedback path from the output node to a second input of the logic device when the output signal completes the transition from the first logic level to the second logic level.

In an exemplary embodiment of the method, the switch is enabled to conduct in response to a rising edge of the input signal. In a further exemplary embodiment, the switch is enabled to conduct in response to a lowered voltage at the control terminal. In a further exemplary embodiment, the switch is selectively enabled to conduct by the logic device in response to a second input signal, preferably by a falling edge of the second input signal. In a further embodiment, the output signal is reset to the first logic level with a second switch controlled by a third input signal, preferably in response to a rising edge of the third input signal. In a further embodiment, the method further includes disabling said switch to conduct by a signal in said feedback path coupled to a set input of an S-R flip-flop, the output of said S-R flip-flop coupled to said second input of said logic device. In a farther embodiment, the method includes applying a falling edge of a second input signal of said edge transition detector to a reset input of said S-R flip-flop to reset said S-R flip-flop Another exemplary embodiment of the invention provides a digital memory device including an array of memory cells and a decoder coupled to the array of memory cells. The digital memory device further includes a control circuit coupled to the decoder to provide a control signal at a control node of the decoder that enables an operation of the decoder. In an exemplary embodiment, the control circuit includes a switch coupled to the control node of the decoder and a logic device with a first input coupled to a control signal node and an output coupled to a control terminal of the switch to enable the switch to conduct, thereby to effect a transition of the control signal from a first logic level to a second logic level in response to a signal at said control signal node. The control circuit further includes a feedback path from the control node to a second input of the logic device to disable conductivity of the switch when the control signal completes the transition from the first logic level to the second logic level. In a further embodiment, the switch is enabled to conduct in response to a rising edge of a signal at the control signal node.

In a further embodiment, the digital memory device is an SRAM memory device. In a further embodiment, the control circuit further includes an inverter in the feedback path. In a further embodiment, the control circuit further includes a second logic device in the feedback path coupled to a second control signal node. In a further preferred embodiment, the control circuit further includes a second switch with a controlled terminal coupled to the control node, said second switch having a control terminal coupled to a third control signal node, wherein a signal at the third control signal node causes the second switch to conduct to transition the output node from the second logic level to the first logic level.

Although the invention has been shown and described primarily in connection with specific exemplary embodiments, it should be understood by those skilled in the art that diverse changes in the configuration and the details thereof can be made without departing from the essence and scope of the invention as defined by the claims below. For example, and without limitation, a falling edge detector, as well as a rising edge detector, is contemplated within the broad scope of the invention. The scope of the invention is therefore determined by the appended claims, and the intention is for all alterations that lie within the range of the meaning and the range of equivalence of the claims to be encompassed by the claims.

What is claimed is:

1. An integrated circuit having an edge transition detector for producing an output signal at an output node in response to an input signal coupled to an input node, said edge transition detector comprising:
    a switch coupled to said output node;
    a logic device with a first input coupled to said input node and an output coupled to a control terminal of said switch to enable said switch to conduct, thereby to effect a transition of said output signal from a first logic level to a second logic level in response to said input signal; and
    a feedback path from said output node to a second input of said logic device, wherein said feedback path disables said switch conductivity when said output signal completes said transition from said first logic level to said second logic level, and wherein said feedback path to said second input of said logic device includes an S-R flip-flop.

2. The integrated circuit as claimed in claim 1, wherein said switch is enabled to conduct in response to a rising edge of said input signal.

3. The integrated circuit as claimed in claim 1, wherein said switch comprises a PMOS switch.

4. The integrated circuit as claimed in claim 1, wherein said switch is selectively enabled to conduct by a second input signal.

5. The integrated circuit as claimed in claim 4, wherein said switch is selectively enabled to conduct by a falling edge of said second input signal.

6. The integrated circuit as claimed in claim 1, wherein a third input signal is coupled to a control terminal of a second switch to reset said output signal to said first logic level.

7. The integrated circuit as claimed in claim 6, wherein said output signal is reset to said first logic level in response to a rising edge of said third input signal.

8. The integrated circuit as claimed in claim 1, wherein said S-R flip-flop is reset by a second input signal of said edge transition detector coupled to a reset input of said S-R flip-flop.

9. A method of producing an output signal at an output node of an edge transition detector in response to an input signal received at an input node thereof, the method comprising:
    applying said received input signal to a logic device;
    applying the output of said logic device to a control terminal of a switch coupled to said output node;
    enabling said switch to conduct by said logic device in response to said input signal, thereby causing said output signal to make a transition from a first logic level to a second logic level in response to said input signal; and
    disabling said switch to conduct with a feedback path from said output node to a second input of said logic device when said output signal completes said transition from said first logic level to said second logic level, wherein disabling said switch further includes disabling said switch to conduct by a signal in said feedback path coupled to a set input of an S-R flip-flop, the output of said S-R flip-flop coupled to said second input of said logic device.

10. The method as claimed in claim 9, wherein said switch is enabled to conduct in response to a rising edge of said input signal.

11. The method as claimed in claim 9, wherein said switch is enabled to conduct in response to a lowered voltage at said control terminal.

12. The method as claimed in claim 9, further including selectively enabling said switch to conduct by said logic device in response to a second input signal to said edge transition detector.

13. The method as claimed in claim 12, wherein said switch is selectively enabled to conduct by a falling edge of said second input signal.

14. The method as claimed in claim 9, further including resetting said output signal to said first logic level with a second switch controlled by a third input signal.

15. The method as claimed in claim 14, wherein said output signal is reset to said first logic level in response to a rising edge of said third input signal.

16. The method as claimed in claim 9, further including applying a falling edge of a second input signal of said edge transition detector to a reset input of said S-R flip-flop to reset said S-R flip-flop.

17. A digital memory device comprising:
an array of memory cells;
a decoder coupled to said array of memory cells;
a control circuit coupled to said decoder to provide a control signal at a control node of said decoder that enables said decoder, said control circuit comprising:
a switch coupled to said control node of said decoder;
a logic device with a first input coupled to a control signal node and an output coupled to a control terminal of said switch to enable said switch to conduct, thereby to effect a transition of said control signal from a first logic level to a second logic level in response to a signal at said control signal node; and
a feedback path from said control node to a second input of said logic device, wherein said feedback path disables conductivity of said switch when said control signal completes said transition from said first logic level to said second logic level, wherein the feedback path includes a S-R flip flop.

18. A digital memory device as claimed in claim 17, wherein said array of memory cells comprises an array of SRAM memory cells.

19. A digital memory device as claimed in claim 17, further including an inverter in said feedback path.

20. A digital memory device as claimed in claim 17, further including a second logic device in said feedback path coupled to a second control signal node.

21. A digital memory device as claimed in claim 17, further including a second switch with a controlled terminal coupled to said control node, said second switch having a control terminal coupled to a third control signal node, wherein a signal at said third control signal node causes said second switch to conduct to transition said output node from said second logic level to said first logic level.

22. A digital memory device as claimed in claim 17, wherein said switch is enabled to conduct in response to a rising edge of said input signal.

23. A digital memory device as claimed in claim 17, wherein said array of memory cells comprises an embedded device.

24. The integrated circuit as claimed in claim 1, wherein the S-R flip-flop comprises a first NOR gate and a second NOR gate, the first NOR gate having an output coupled to an input of the second NOR gate, and the second NOR gate having an output coupled to an input of the first NOR gate.

25. The digital memory device as claimed in claim 17, wherein the S-R flip-flop comprises a first NOR gate and a second NOR gate, the first NOR gate having an output coupled to an input of the second NOR gate, and the second NOR gate having an output coupled to an input of the first NOR gate.

* * * * *